United States Patent
Wang

(10) Patent No.: US 11,798,939 B2
(45) Date of Patent: Oct. 24, 2023

(54) FIN FIELD EFFECT TRANSISTOR (FINFET) DEVICE WITH PROTECTION LAYER

(71) Applicant: Taiwan Semiconductor Manufacturing Co., Ltd., Hsinchu (TW)

(72) Inventor: Shiang-Bau Wang, Taoyuan County (TW)

(73) Assignee: TAIWAN SEMICONDUCTOR MANUFACTURING CO., LTD, Hsinchu (TW)

(*) Notice: Subject to any disclaimer, the term of this patent is extended or adjusted under 35 U.S.C. 154(b) by 69 days.

(21) Appl. No.: 16/707,214

(22) Filed: Dec. 9, 2019

(65) Prior Publication Data
US 2020/0119005 A1  Apr. 16, 2020

Related U.S. Application Data

(62) Division of application No. 14/472,566, filed on Aug. 29, 2014, now Pat. No. 10,504,893.

(51) Int. Cl.
| | |
|---|---|
| H01L 27/088 | (2006.01) |
| H01L 29/06 | (2006.01) |
| H01L 29/78 | (2006.01) |
| H01L 21/8234 | (2006.01) |
| H01L 21/324 | (2006.01) |
| H01L 29/66 | (2006.01) |

(52) U.S. Cl.
CPC ........ *H01L 27/0886* (2013.01); *H01L 21/324* (2013.01); *H01L 21/823431* (2013.01); *H01L 21/823481* (2013.01); *H01L 29/0653* (2013.01); *H01L 29/66795* (2013.01); *H01L 29/7853* (2013.01)

(58) Field of Classification Search
CPC ......... H01L 29/7853; H01L 21/823481; H01L 29/7851; H01L 29/785; H01L 21/823431; H01L 27/0886; H01L 21/76224; H01L 29/66795
See application file for complete search history.

(56) References Cited

U.S. PATENT DOCUMENTS

| | | | |
|---|---|---|---|
| 8,470,714 | B1 | 6/2013 | Tsai et al. |
| 9,099,325 | B2 | 8/2015 | Kim et al. |
| 2002/0109182 | A1 | 8/2002 | Lee et al. |
| 2005/0145932 | A1 | 7/2005 | Park et al. |

(Continued)

*Primary Examiner* — Samuel A Gebremariam
*Assistant Examiner* — Jonas T Beardsley
(74) *Attorney, Agent, or Firm* — McClure, Qualey & Rodack, LLP

(57) ABSTRACT

A method for forming a fin field effect transistor (FinFET) device structure and method for forming the same are provided. The method includes providing a substrate, and forming a fin structure on the substrate. The method also includes forming a protection layer on the sidewalls of the fin structure, and forming a dielectric layer on the fin structure and the protection layer. The method further includes removing a portion of the dielectric layer until a portion of the protection layer is exposed, and removing the exposed portion of the protection layer, such that the sidewalls of a lower portion of the fin structure are covered by the protection layer, and the sidewalls of an upper portion of the fin structure are not covered by the protection layer.

20 Claims, 10 Drawing Sheets

(56) References Cited

U.S. PATENT DOCUMENTS

| | | | |
|---|---|---|---|
| 2007/0020902 A1* | 1/2007 | Chung | H01L 29/66818 438/270 |
| 2008/0050885 A1 | 2/2008 | Tang et al. | |
| 2008/0079070 A1* | 4/2008 | Seo | H01L 29/1037 257/E21.429 |
| 2008/0121970 A1* | 5/2008 | Aritome | H01L 29/66825 438/257 |
| 2009/0294840 A1* | 12/2009 | Gilgen | H01L 27/0886 257/327 |
| 2011/0117679 A1 | 5/2011 | Lee et al. | |
| 2013/0126978 A1 | 5/2013 | Becker et al. | |
| 2013/0264621 A1* | 10/2013 | Nishi | H01L 29/7853 257/E21.409 |
| 2014/0103482 A1 | 4/2014 | Kim et al. | |
| 2014/0252428 A1* | 9/2014 | Chang | H01L 29/7851 257/288 |
| 2015/0014808 A1* | 1/2015 | Tsai | H01L 29/7853 438/424 |
| 2015/0102386 A1* | 4/2015 | Chen | H01L 29/0649 438/424 |
| 2015/0255542 A1* | 9/2015 | Cai | H01L 29/7843 438/283 |
| 2015/0303249 A1 | 10/2015 | Bentley et al. | |

\* cited by examiner

FIN FIELD EFFECT TRANSISTOR (FINFET) DEVICE WITH PROTECTION LAYER

CROSS REFERENCE TO RELATED APPLICATIONS

This application is a Divisional application of U.S. patent application Ser. No. 14/472,566, filed on Aug. 29, 2014, now U.S. Pat. No. 10,504,893, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and allowing a higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
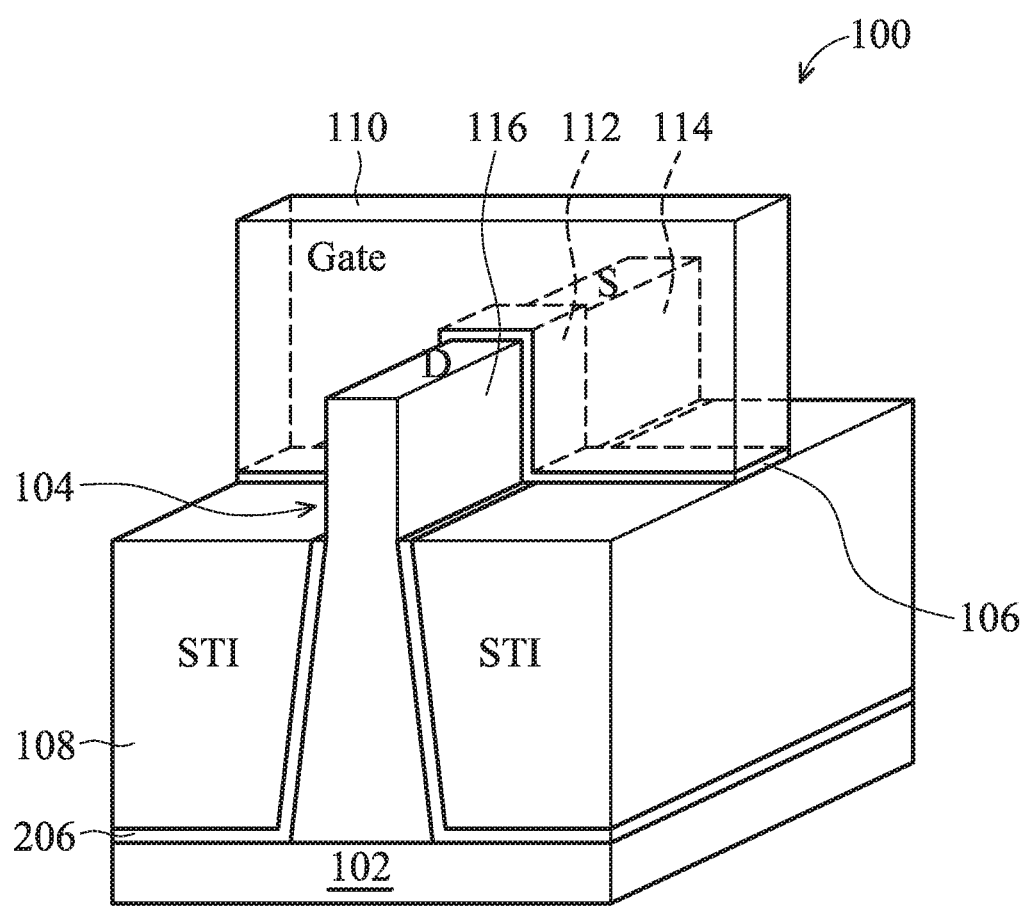
FIG. 1 shows a cross-sectional representation of a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a fin field effect transistor (FinFET) device structure with a protection layer are provided. FIG. 1 shows a perspective representation of a fin field effect transistor (FinFET) device structure 100, in accordance with some embodiments of the disclosure.

The FinFET device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The FinFET device structure 100 also includes a fin structure 104 (e.g., Si fins) that extends from the substrate 102. In some other embodiments, more than one fin structure 104 extends from the substrate 102. The fin structure 104 may optionally include germanium (Ge). The fin structure 104 may be formed by using suitable processes such as photolithography and etching processes. In some embodiments, the fin structure 104 is etched from the substrate 102 using dry etch or plasma processes.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 100 further includes a gate stack structure including a gate electrode 110 and a gate dielectric layer 106. The gate stack structure is formed over a central portion of the fin structure 104. In some embodiments, multiple gate stack structures are formed over the fin structure 104. Numerous other layers may also be present in the gate structures, for example, capping layers, interface layers, spacer elements, and/or other suitable features.

The gate dielectric layer 106 may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 110 may include polysilicon or metal. Metal includes tantalum nitride (TaN), nickel silicon (NiSi), cobalt silicon (CoSi), molybdenum (Mo), copper (Cu), tungsten (W), alumina (Al), cobalt (Co), zirconium (Zr), platinum (Pt), or other applicable materials. The gate electrode 110 may be formed in a gate last process (or gate replacement process). In some embodiments, the gate stack structure includes additional layers, such as interfacial layers, capping layers, diffusion/barrier layers, or other applicable layers.

The fin structure 104 includes a channel region 112 surrounded or wrapped by gate electrode 110 and gate dielectric layer 106. Fin structure 104 may be doped to provide a suitable channel for an n-type FinFET (NMOS device) or a p-type FinFET (PMOS device). The fin structures 104 may be doped using a suitable process, such as an ion implantation process, diffusion process, annealing process, other applicable processes, or combinations thereof. The fin structure 104 includes a source region 114 and a drain region 116 between the channel region 112. The FinFET device 100 may be a device included in a microprocessor, memory cell (e.g., Static Random-Access Memory (SRAM)), and/or other integrated circuits.

FIGS. 2A-2L show cross-sectional representations of various stages of forming a fin field effect transistor (FinFET) device structure, in accordance with some embodiments.

Figure 2A:
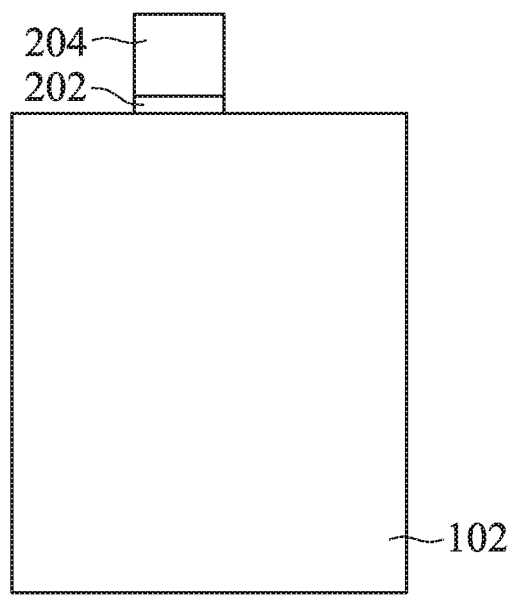
FIGS. 2A-2L show cross-sectional representations of various stages of forming a fin field effect transistor (FinFET) device structure, in accordance with some embodiments of the disclosure.

Referring to FIG. 2A, the substrate 102 is provided. In some embodiments, a silicon (Si) substrate 102 is provided. Afterwards, an oxide material and a hard mask material are formed on the substrate 102 and patterned by a patterning process to form the pad oxide layer 202 and the hard mask layer 204. The pad oxide layer 202 is a buffer layer between the substrate 102 and the hard mask layer 204. In addition, the pad oxide layer 202 is used as a stopping layer when the hard mask layer 204 is removed.

The pad oxide layer 202 may be made of silicon oxide. The hard mask layer 204 may be made of silicon oxide, silicon nitride, silicon oxynitride, or other applicable materials. In some other embodiments, more than one hard mask layer 204 is formed on the pad oxide layer 202.

The oxide material and the hard mask material are formed by deposition processes, such as a chemical vapor deposition (CVD) process, high-density plasma chemical vapor deposition (HDPCVD) process, spin-on process, sputtering process, or other applicable processes.

The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 2B:
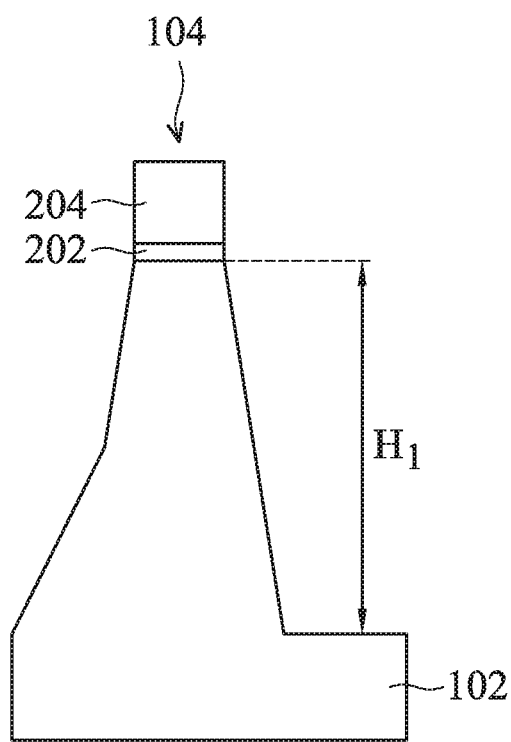

After the pad oxide layer 202 and the hard mask layer 204 are formed, an etching process is performed on the substrate 102 to form the fin structure 104 as shown in FIG. 2B, in accordance with some embodiments. In some embodiments, the hard mask layer 204 has multiple layers. It should be noted that the number of the fin structures 104 may be adjusted according to actual application, and it is not limited to one fin structure 104. The fin structure 104 has a width that gradually increases from the top upper portion 104a to the lower portion 104b.

The etching process may be a dry etching process or a wet etching process. In some embodiments, the substrate 102 is etched by a dry etching process, and the fluorine-based etchant gas includes $SF_6$, $C_xF_y$, $NF_3$ or combinations thereof. The etching process may be a time-controlled process, and continue until the fin structure 104 reaches a predetermined height $H_1$. In some embodiments, the height $H_1$ is in a range from 50 nm to about 250 nm.

Figure 2C:
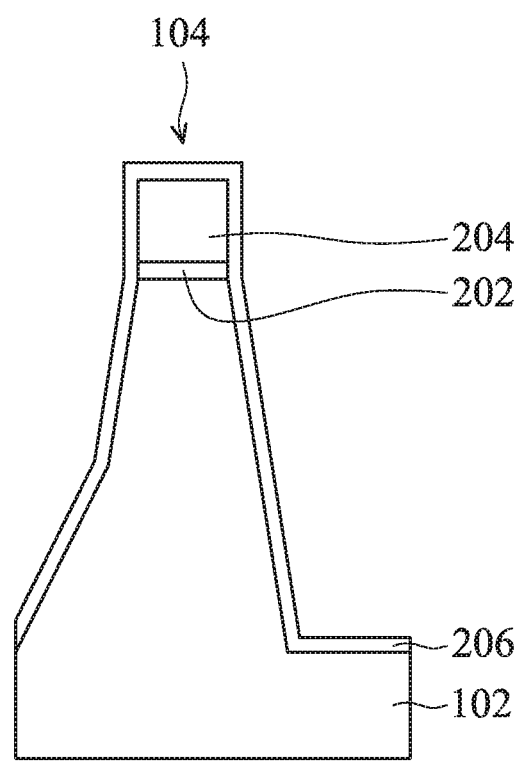

After the fin structure 104 is formed, a protection layer 206 is conformally formed on the sidewalls of the fin structure 104 as shown in FIG. 2C in accordance with some embodiments.

The protection layer 206 is used to protect the fin structures 104 from being damaged by the following processes (such as an anneal process or an etching process). Therefore, the profile of the fin structures 104 is preserved by the protection of the protection layer 206. The protection layer 206 includes silicon nitride, silicon oxynitride, silicon carbide, silicon oxycarbonnitride or combinations thereof.

The protection layer 206 may have a single layer or multiple layers. In some embodiments, the protection layer 206 has a thickness in a range from 0.5 nm to about 10 nm. If the thickness of the protection layer 206 is too thin, its protective effect is not sufficient. If the thickness of the protection layer 206 is too thick, the removal of the protection layer 206 will become more difficult.

Figure 2D:
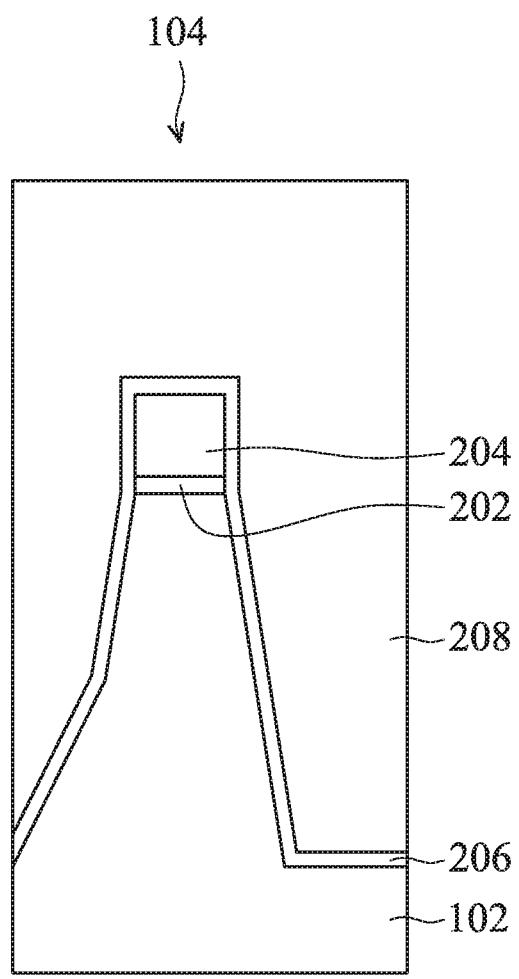

After the protection layer 206 is formed, a dielectric layer 208 is formed on the fin structure 104 and the protection layer 206 as shown in FIG. 2D, in accordance with some embodiments. In some embodiments, a dielectric material is deposited on the fin structure 104 and the protection layer 206, and afterwards a first anneal process is performed to the dielectric material. During the first anneal process, the dielectric material is transformed from liquid form into solid form to form the dielectric layer 208.

In some embodiments, a first rapid thermal annealing (RTA) process is performed on the fin structure 104. In some embodiments, the first rapid thermal annealing (RTA) process with steam is performed at a temperature in a range from about 200° C. to about 700° C. In some other embodiments, the first rapid thermal annealing (RTA) process without steam is performed at a temperature in a range from about 700° C. to about 1100° C.

The dielectric layer 208 may be made of one or more dielectric materials, such as silicon oxide, silicon nitride, low-k dielectric materials. The dielectric layer 208 may be deposited by a chemical vapor deposition (CVD) process, a spin-on-glass process, or another applicable process.

Figure 2E:
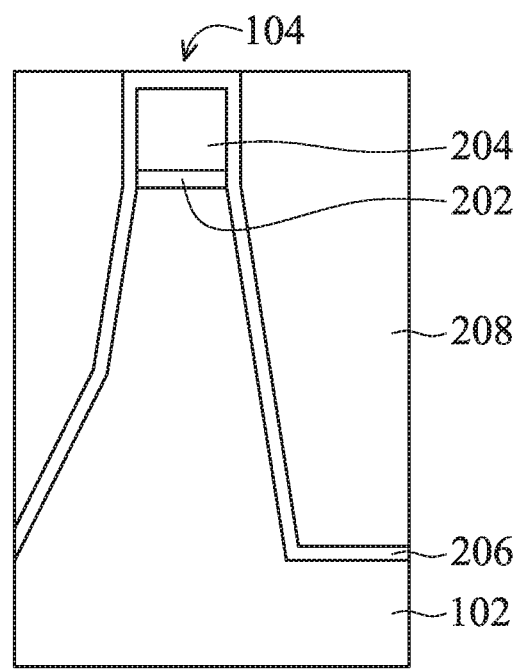

After the dielectric layer 208 is formed on the fin structures 104, the dielectric layer 208 is thinned or planarized until a top surface of the dielectric layer 208 is level with a top surface of the protection layer 206 as shown in FIG. 2E, in accordance with some embodiments. The protection layer 206 is used as a stopping layer. In some embodiments, the dielectric layer 208 is thinned by a chemical mechanical polishing (CMP) process.

Afterwards, a second anneal process is performed to the dielectric layer 208 to densify the bottom portion of the dielectric layer 208. In some embodiments, a second rapid thermal annealing (RTA) process is performed to the dielectric layer 208. In some embodiments, the second rapid thermal annealing (RTA) process with steam is performed at a temperature in a range from about 200° C. to about 700° C. In some other embodiments, the second rapid thermal annealing (RTA) process without steam is performed at a temperature in a range from about 700° C. to about 1100° C.

It should be noted that an oxidizing agent and moisture are supplied into a reaction chamber during the first anneal process and the second anneal process. The fin structure 104 may be easily oxidized by the oxidizing agent and moisture under high temperature. Once the fin structure 104 is oxidized, the oxidized portion of the fin structure 104 may be etched or removed by the following processes. In some embodiments, the fin structure 104 is made of silicon, a portion of the fin structure 104 is changed to silicon oxide during the first anneal process and/or the second anneal process. The silicon oxide is easily removed by the following etching process.

Therefore, the protection layer 206 is formed on the sidewalls of the fin structure 104 to prevent the fin structure 104 from becoming exposed to the oxidizing agent and moisture.

Figure 2F:
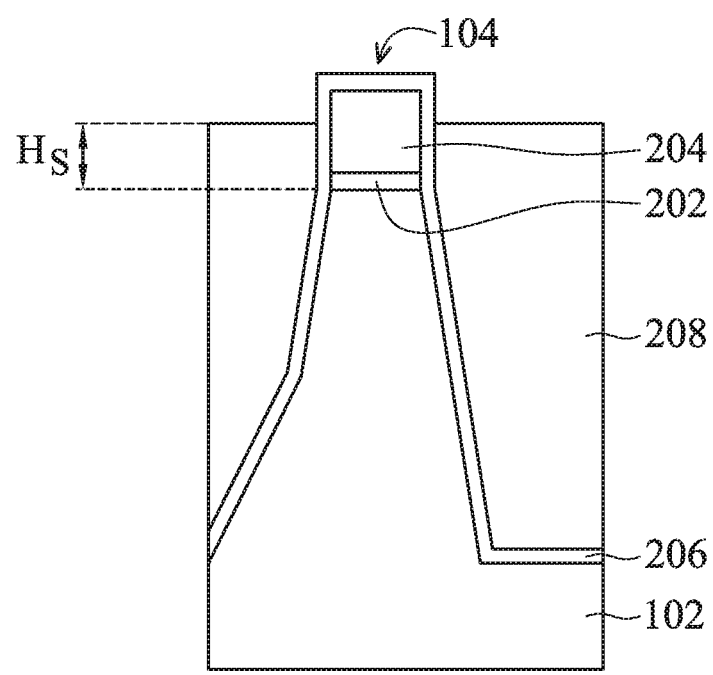

After the second anneal process, a portion of the dielectric layer 208 is removed as shown in FIG. 2F, in accordance with some embodiments. The dielectric layer 208 is removed by an etching process, such as a dry etching process or a wet etching process. Therefore, a portion of fin structures 104 and a portion of the protection layer 206 protrude from the dielectric layer 208. In other words, a top surface of the fin structure 104 is higher than a top surface of the dielectric layer 208 and a top surface of the protection layer 206. The removal of the portion of the dielectric layer 208 is used to control the step height Hs before a poly gate electrode (not shown) is deposited in the following process.

Figure 2G:
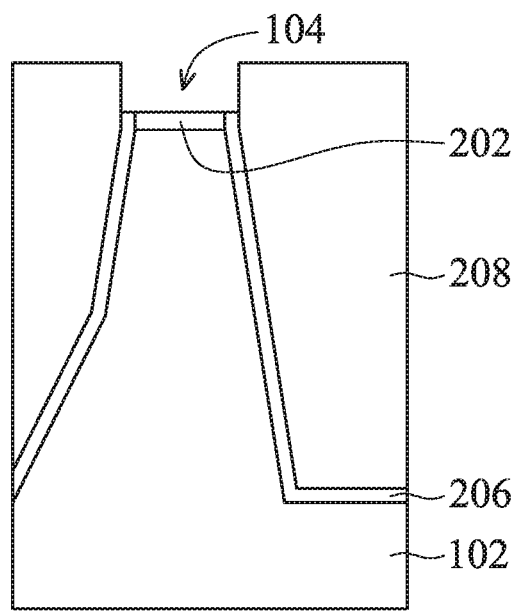

After the portion of the dielectric layer 208 is removed, the protection layer 206 and the hard mask layer 204 above the dielectric layer 208 are sequentially removed as shown in FIG. 2G, in accordance with some embodiments.

The protection layer 206 and the hard mask layer 204 are respectively removed by an etching process, such as a dry etching process or a wet etching process. In some embodiments, when the protection layer 206 is made of silicon nitride, a wet etching process is performed to the protection layer 206 by using phosphoric acid ($H_3PO_4$) solution as an etchant.

Figure 2H:
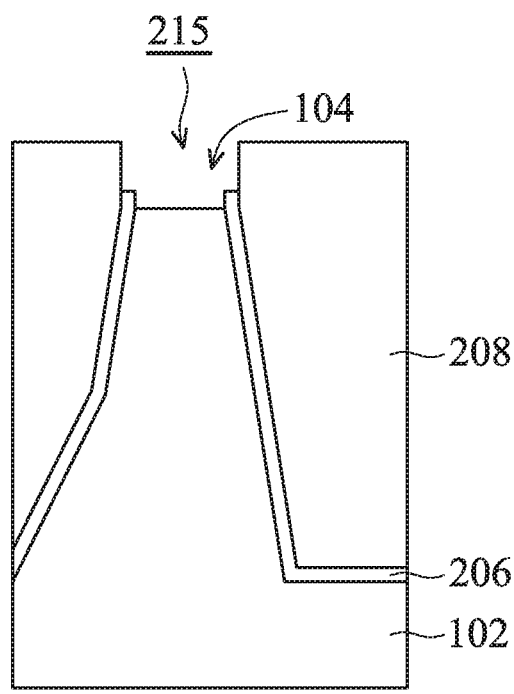

After the hard mask layer 204 above the dielectric layer 208 is removed, the pad oxide layer 202 is removed as shown in FIG. 2H, in accordance with some embodiments. Therefore, a recess 215 is formed in the dielectric layer 208. The pad oxide layer 202 is removed by an etching process, such as a dry etching process or a wet etching process. In some embodiments, when the protection layer 206 is made of silicon oxide, a wet etching process is performed to the protection layer 206 by using dilute hydrogen fluoride (HF) solution as an etchant.

Figure 2I:
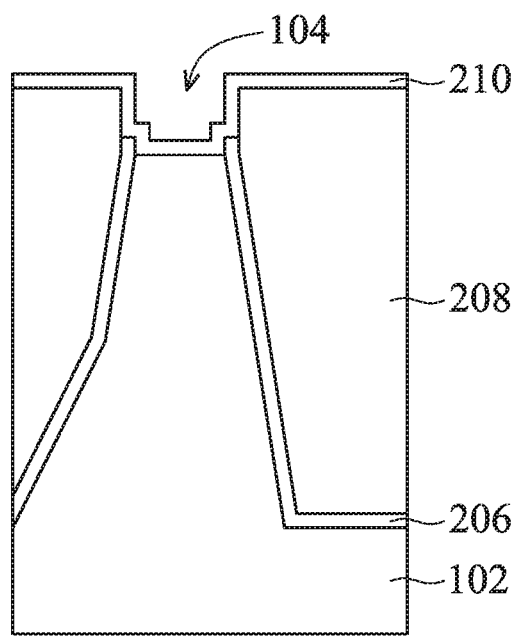

After the pad oxide layer 202 is removed, a sacrificial oxide layer 210 is formed on the dielectric layer 208 and the fin structure 104 as shown in FIG. 2I in accordance with some embodiments. In other word, the sacrificial oxide layer 210 is conformally formed on the recess 215. The sacrificial oxide layer 210 is used to protect the fin structure 104 during the subsequent ion implantation process.

In some embodiments, the sacrificial oxide layer 210 is silicon oxide. In some embodiments, the sacrificial oxide layer 210 is formed by growing a thin layer of thermal oxide. In some embodiments, the sacrificial oxide layer 210 is deposited by a chemical vapor deposition (CVD) process, an atomic layer deposition (ALD) process, a sputtering process, or other applicable processes.

Figure 2J:
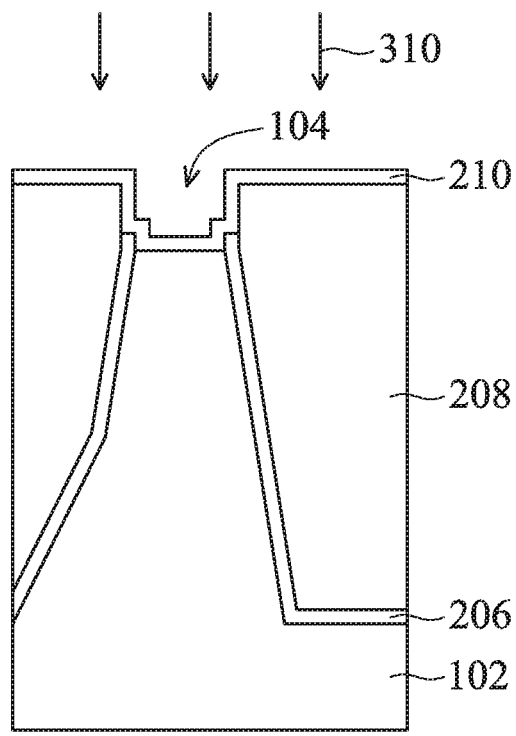

After the sacrificial oxide layer 210 is formed on the dielectric layer 208 and the fin structure 104, an ion implantation process 310 is performed to the fin structure 104, as shown in FIG. 2J, in accordance with some embodiments. The ion implantation process 310 is used to dope the fin structure 104 to form the doped well regions. In some embodiments, the fin structure 104 is doped with an n-type dopant, such as arsenic (As), phosphorous (P) or antimony (Sb). In some other embodiments, the fin structure 104 is doped with a p-type dopant, such as boron (B) or boron fluorine ($BF_2$).

Afterwards, a third anneal process is performed to the fin structure 104 to activate the implanted dopant ions. In some embodiments, a third rapid thermal annealing (RTA) process is performed to the fin structure 104. In some embodiments, the third rapid thermal annealing (RTA) process with a steam is performed at a temperature in a range from about 200° C. to about 700° C. In some other embodiments, the first rapid thermal annealing (RTA) process without a steam is performed at a temperature in a range from about 700° C. to about 1100° C.

It should be noted that the fin structure 104 may be oxidized by the oxidizing agent and moisture under high temperature during the third anneal process. Once the fin structure 104 is oxidized, the oxidized portion of the fin structure 104 may be etched or removed by the following processes. In order to prevent the oxidation of the fin structure 104, the protection layer 206 formed on the sidewall of the fin structure 104 is used to protect and preserve the fin profile.

Figure 2K:
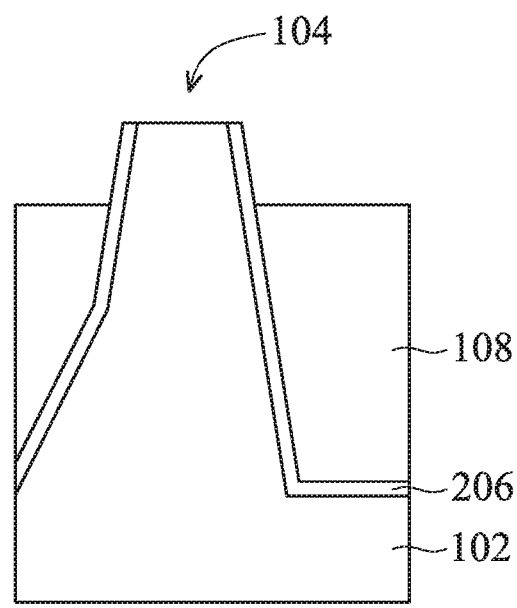

After the ion implant process, an upper portion of the dielectric layer 208 is removed until the a portion of the fin structure 104 is exposed as shown in FIG. 2K, in accordance with some embodiments. The upper portion of the dielectric layer 208 is removed to form the isolation structure 108.

In some embodiments, the dielectric layer 208 is removed by an etching process, such as a dry etching process or a wet etching process. In some embodiments, the dielectric layer 208 is removed by a chemical oxide removal (COR) operation and a post healing treatment (PHT) operation. In the chemical oxide removal (COR) operation, hydrogen fluoride (HF) and ammonia ($NH_3$) are provided on the surface of the dielectric layer 208, and the temperature of the reaction chamber is controlled at a range from about 20° C. to about 85° C. In the post healing treatment (PHT) operation, the temperature of the reaction chamber is controlled at a range from about 100° C. to about 200° C., and nitrogen gas ($N_2$) is purged on the surface of the dielectric layer 208. If the dielectric layer 208 is too thick, the COR operation and the PHT operation may be repeated.

Figure 2L:
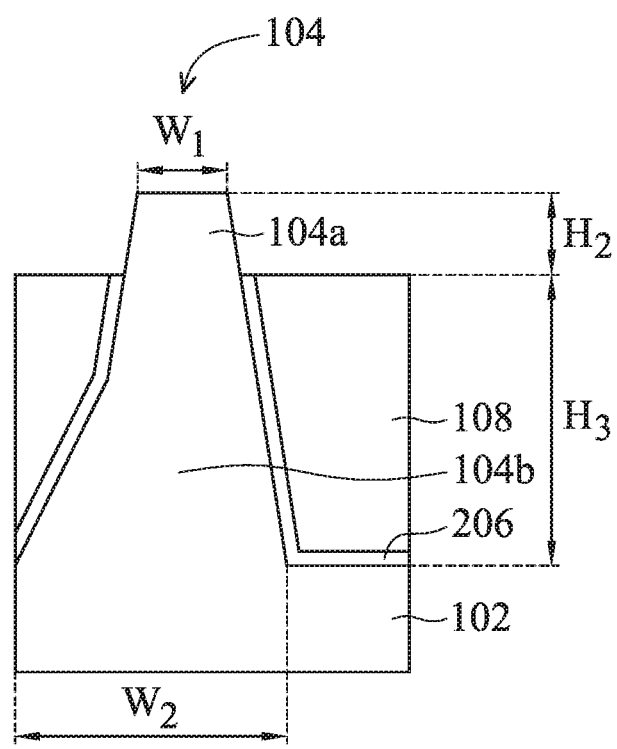

After the isolation structure 108 is formed, the exposed protection layer 206 is removed as shown in FIG. 2L, in accordance with some embodiments. In some embodiments, when the protection layer 206 is made of silicon nitride, the protection layer 206 is removed by a phosphoric acid ($H_3PO_4$) solution at a temperature range from about 160° C. to about 165° C.

As shown in FIG. 2L, the fin structure 104 has an upper portion 104a and a lower portion 104b. The upper portion 104a is above the isolation structure 108, and the lower portion 104b is below the isolation structure 108. It should be noted that the upper portion of the protection layer 206 which is formed on the upper portion 104a is removed, but the remaining protection layer 206 is still formed on the sidewalls of the lower portion 104b of the fin structure 104. In other words, the sidewalls of the lower portion 104b of the fin structure 104 are covered by the protection layer 206. In addition, the sidewalls of the upper portion 104a of the fin structure 104 are not covered by the protection layer 206.

The upper portion 104a has a height $H_2$ and a greatest width $W_1$. The lower portion 104b has a height $H_3$ and a greatest width $W_2$. In some embodiments, a ratio ($H_2/H_3$) of the upper portion 104a of the fin structure 104 to the lower portion 104b of the fin structure 104 is in a range from about 0.1 to about 0.5. In some embodiments, a ratio ($W_1/W_2$) of the largest width $W_1$ of the upper portion 104a to the largest width $W_2$ of the lower portion 104b of the fin structure 104 is in a range from about 0.025 to about 1.

FIGS. 3A-3D show cross-sectional representations of various stages of forming a fin field effect transistor (FinFET) device structure, in accordance with some embodiments of the disclosure.

Figure 3A:
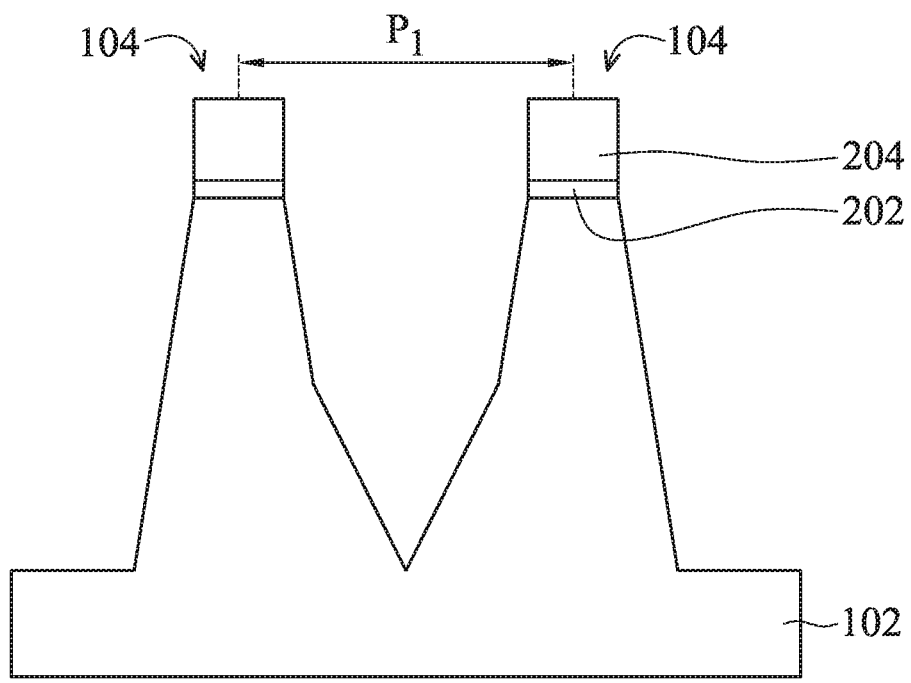
FIGS. 3A-3D show cross-sectional representations of various stages of forming a fin field effect transistor (FinFET) device structure, in accordance with some embodiments of the disclosure.
Figure 3B:
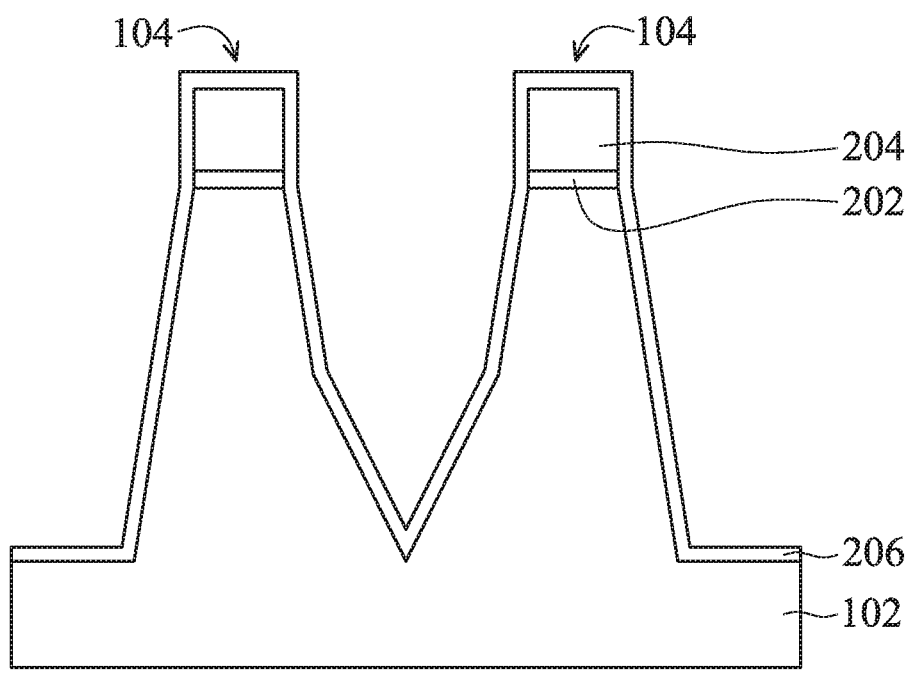

As shown in FIG. 3A, two fin structures 104 are formed on the substrate 102. Like FIG. 2B, the pad oxide layer 202 and the hard mask layer 204 are formed on each of the fin structures 104. In some embodiments, a pitch Pi between two adjacent fin structures 104 is in a range from about 5 nm to 1000 nm.

After the fin structures 104 are formed on the substrate 102, the protection layer 206 is formed on the fin structures 104 as shown in FIG. 0.3B, in accordance with some embodiments of the disclosure. The protection layer 206 includes silicon nitride, silicon oxynitride, silicon carbide, silicon oxycarbonnitride or combinations thereof. The protection layer 206 may have a single layer or multiple layers.

Figure 3C:
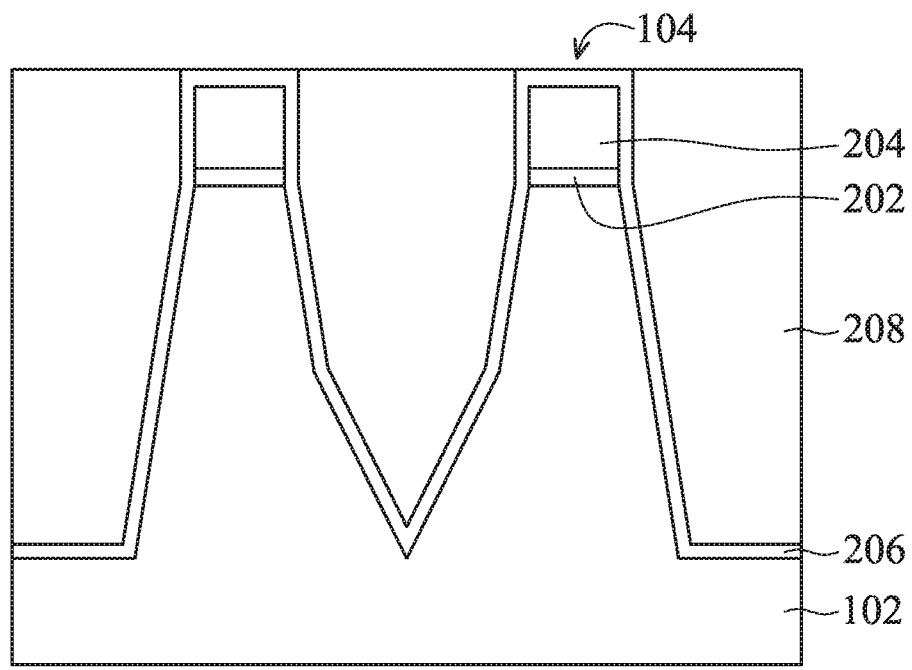

Afterwards, the dielectric layer 208 is formed on the fin structures 104 and thinned until a top surface of the dielectric layer 208 is level with a top surface of the protection layer 206 as shown in FIG. 3C, in accordance with some embodiments of the disclosure. In some embodiments, the dielectric layer 208 is thinned by a chemical mechanical polishing (CMP) process.

It should be noted that before and after the chemical mechanical polishing (CMP) process, a first anneal process and a second anneal process are performed to the fin structures 104. The fin structures 104 may be oxidized by the first anneal process and/or the second anneal process. Once the fin structures 104 is oxidized, the oxidized portion of the fin structures 104 is easily removed by the etching process. Therefore, the fin profile is destroyed and the FinFET device structure may further be degraded. In order to maintain the profile of the fin structures 104, the protection layer 206 is conformally formed on the sidewalls of the fin structures 104 and provides a shielding effect to prevent the fin structures 104 being oxidized.

Figure 3D:
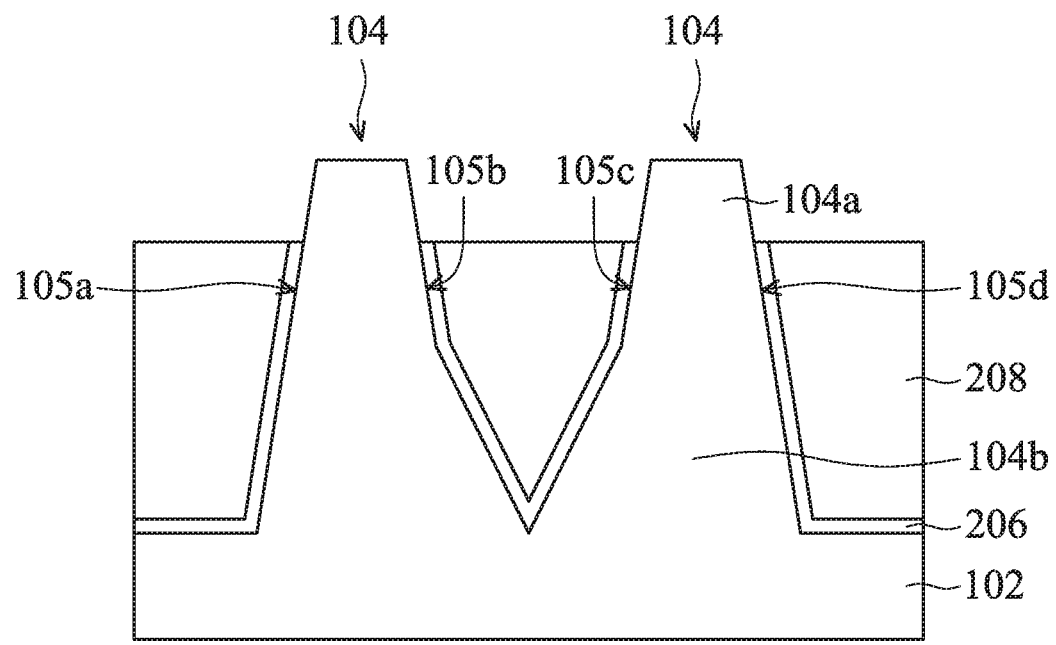

Afterwards, the structure in FIG. 3C continues with the operations like FIGS. 2F-2K, and a structure in FIG. 3D is obtained. Between FIG. 3C and FIG. 3D, the ion implantation process and the third anneal process are performed to the fin structures 104. It should be noted that because each of the fin structures 104 is protected by the protection layer 206, each of the fin structures 104 is not oxidized. Therefore, the fin profile is prevented from being etched by the etching process that follows.

As shown in FIG. 3D, each of the fin structures 104 has an upper portion 104a and a lower portion 104b. The upper portion 104a is above the isolation structure 108, and the lower portion 104b is below the isolation structure 108. It should be noted that the upper portion of the protection layer 206 that is formed on the upper portion 104a is removed, but the remaining protection layer 206 remains on the sidewalls of the lower portion 104b.

The left fin structure 104 has a first sidewall 105a and a second sidewall 105b, and the right fin structure 104 has a third sidewall 105c and a sidewall 105d. The second sidewall 105b is adjoined to the third sidewall 105c. The protection layer 206 is extended from a portion of the second sidewall 105b to the third sidewall 105c.

Some processes may then be performed to finish the formation of the fin field effect transistor (FinFET) device structure 100. For example, the gate stack structure, including a gate electrode 110 and a gate dielectric layer 106, is formed over a central portion of fin structure 104.

Embodiments of a fin field effect transistor (FinFET) device structure and method for forming the same are provided. A fin structure extends above a substrate and is embedded in an isolation structure. The fin structure has an upper portion and a lower portion. The lower portion of the fin structure is below the isolation structure. A protection layer is formed on the sidewalls of the lower portion of the fin structure. The protection layer is used to protect the fin structure from being damaged by the fabrication processes (such as annealing processes or etching processes). Furthermore, the fin profile is preserved and uniform fin structure is obtained. Therefore, the performance of the FinFET device structure is improved.

In some embodiments, a method for forming a fin field effect transistor (FinFET) device structure is provided. The method includes providing a substrate, and forming a fin structure on the substrate. The method also includes forming a protection layer on the sidewalls of the fin structure, and forming a dielectric layer on the fin structure and the protection layer. The method further includes removing a portion of the dielectric layer until a portion of the protection layer is exposed, and removing the exposed portion of the protection layer, such that the sidewalls of a lower portion of the fin structure are covered by the protection layer, and the sidewalls of an upper portion of the fin structure are not covered by the protection layer.

In some embodiments, a fin field effect transistor (FinFET) device structure is provided. The FinFET device structure includes a first fin structure having a first sidewall and a second sidewall extending above a substrate, and the first sidewall and the second sidewall are at opposite sides of a center plane of the first fin structure. The FinFET device structure also includes an isolation structure formed on the substrate, and an upper portion of the first fin structure extends above the isolation structure. A first angle is between the first sidewall of the first fin structure and a top surface of the isolation structure, a second angle is between the second sidewall of the first fin structure and the top surface of the isolation structure, the first angle is an acute angle, and the second angle is an acute angle. The first angle is different from the second angle.

In some embodiments, a fin field effect transistor (FinFET) device structure is provided. The FinFET device structure includes a first fin structure formed on a substrate, and the fin structure has a first sidewall and a second sidewall. The FinFET device structure further includes a second fin structure formed adjacent to the first fin structure, and the second fin structure has a third sidewall and a fourth sidewall. The FinFET device structure includes an isolation structure formed on the substrate and between the first fin structure and the second fin structure. A top portion of the second sidewall of the first fin structure has a first inclination with respect to the top surface of the isolation structure, and a bottom portion of the second sidewall of the first fin structure has a second inclination with respect to the top surface of the isolation structure, and there is a turning point between the first inclination and the second inclination.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a first fin structure having a first sidewall and a second sidewall extending above a substrate, wherein the first sidewall and the second sidewall are at opposite sides of a center plane of the first fin structure;
   an isolation structure formed on the substrate, wherein an upper portion of the first fin structure extends above the isolation structure, the isolation structure has a first portion on the first sidewall of the first fin structure and a second portion on the second sidewall of the first fin structure, and a lowest surface of the first portion of the isolation structure is lower than a lowest surface of the second portion of the isolation structure;
   wherein a first angle is between the first sidewall of the first fin structure and a top surface of the isolation structure, a second angle is between the second sidewall of the first fin structure and the top surface of the isolation structure, the first angle is an acute angle, the second angle is an acute angle, and the first angle is different from the second angle;
   a nitride layer formed on and in direct contact with a portion of the second sidewall of the first fin structure, wherein the nitride layer has a top portion and a bottom portion, a turning point between the top portion and the bottom portion, and the turning point is lower than the top surface of the isolation structure; and
   a second fin structure adjacent to the first fin structure, wherein the second fin structure has a third sidewall facing towards the second sidewall of the first fin structure, wherein a lowest point of the second sidewall of the first fin structure is in direct contact with a lowest point of the third sidewall of the second fin structure, wherein the nitride layer has a first portion formed on the first sidewall of the first fin structure, a second portion formed on the second sidewall of the first fin structure, and a third portion formed on the third sidewall of the second fin structure, wherein the second portion of the nitride layer, the third portion of the nitride layer and the top surface of the isolation structure form a substantially pentagonal-shaped structure.

2. The fin field effect transistor (FinFET) device structure as claimed in claim 1, wherein the first sidewall and the second sidewall are covered by the isolation structure.

3. The fin field effect transistor (FinFET) device structure as claimed in claim 1, wherein the second fin structure has a third sidewall facing towards the second sidewall of the first fin structure, wherein the second sidewall intersects the third sidewall to form a substantially V-shaped structure.

4. The fin field effect transistor (FinFET) device structure as claimed in claim 3, wherein the top surface of the isolation structure, the second sidewall and the third sidewall form a substantially pentagonal-shaped structure.

5. The fin field effect transistor (FinFET) device structure as claimed in claim 1, wherein the second sidewall of the first fin structure has a top portion with a first slope and a bottom portion with a second slope, and the first slope is different from the second slope, and there is an obtuse angle between the first slope and the second slope.

6. The fin field effect transistor (FinFET) device structure as claimed in claim 5, wherein a first maximum horizontal distance along a horizontal direction between the top portion of the second sidewall and the first sidewall is smaller than a second maximum horizontal distance along the horizontal direction between the bottom portion of the second sidewall and the first sidewall.

7. The fin field effect transistor (FinFET) device structure as claimed in claim 1, wherein the turning point of the nitride layer is higher than the lowest point of the second sidewall of the first fin structure.

8. A fin field effect transistor (FinFET) device structure, comprising:
   a first fin structure formed on a substrate, wherein the fin structure has a first sidewall and a second sidewall;
   a second fin structure formed adjacent to the first fin structure, wherein the second fin structure has a third sidewall and a fourth sidewall, wherein the third sidewall intersects the second sidewall to form a substantially first V-shaped structure;
   an isolation structure formed on the substrate and between the first fin structure and the second fin structure,
   wherein a top portion of the second sidewall of the first fin structure has a first inclination with respect to the top surface of the isolation structure, and a bottom portion of the second sidewall of the first fin structure has a second inclination with respect to the top surface of the isolation structure, and there is a turning point between the first inclination and the second inclination, and the turning point is lower than the top surface of the isolation structure; and
   a nitride layer having a first portion formed on the first sidewall of the first fin structure, a second portion formed on the second sidewall of the first fin structure, and a third portion formed on the third sidewall of the second fin structure, wherein the second portion of the nitride layer, the third portion of the nitride layer and the top surface of the isolation structure form a substantially pentagonal-shaped structure.

9. The fin field effect transistor (FinFET) device structure as claimed in claim 8, wherein an angle between the first inclination and the second inclination is an obtuse angle.

10. The fin field effect transistor (FinFET) device structure as claimed in claim 8, wherein the nitride layer is extended from the second sidewall to the third sidewall, the second portion of the nitride layer and the third portion of the nitride layer form a substantially second V-shaped structure.

11. The fin field effect transistor (FinFET) device structure as claimed in claim 8, wherein a first maximum horizontal distance along a horizontal direction between the top portion of the second sidewall and the first sidewall is smaller than a second maximum horizontal distance along the horizontal direction between the bottom portion of the second sidewall and the first sidewall.

12. The fin field effect transistor (FinFET) device structure as claimed in claim 8, wherein the turning point between the first inclination and the second inclination is higher than a lowest surface of the nitride layer.

13. A fin field effect transistor (FinFET) device structure, comprising:
an isolation structure formed on a substrate;
a first fin structure formed on the isolation structure, wherein the fin structure has a first sidewall and a second sidewall;
a second fin structure formed adjacent to the first fin structure, wherein the second fin structure has a third sidewall and a fourth sidewall, wherein a lowest point of the third sidewall is in direct contact with a lowest point of the second sidewall to form a lowest point of a V-shaped structure, a first angle between the fourth sidewall and a top surface of the substrate, and the first angle is an obtuse angle; and
a nitride layer having a first portion formed on the first sidewall of the first fin structure and a second portion formed on the second sidewall of the first fin structure and a third portion formed on the third sidewall of the second fin structure, wherein the second portion of the nitride layer, the third portion of the nitride layer and a top surface of the isolation structure form a substantially pentagonal-shaped structure, wherein a portion of the first portion of the nitride layer is lower than the second portion of the nitride layer, the nitride layer is in direct contact with the first fin structure, and a topmost surface of the nitride layer is lower than a top surface of the first fin structure.

14. The fin field effect transistor (FinFET) device structure as claimed in claim 13, wherein the top surface of the isolation structure, the second sidewall and the third sidewall form a substantially pentagonal-shaped structure.

15. The fin field effect transistor (FinFET) device structure as claimed in claim 13, wherein the second sidewall of the first fin structure has a top portion with a first slope and a bottom portion with a second slope, and the first slope is different from the second slope, and there is an obtuse angle between the first slope and the second slope.

16. The fin field effect transistor (FinFET) device structure as claimed in claim 15, wherein a first maximum horizontal distance along a horizontal direction between the top portion of the second sidewall and the first sidewall is smaller than a second maximum horizontal distance along the horizontal direction between the bottom portion of the second sidewall and the first sidewall.

17. The fin field effect transistor (FinFET) device structure as claimed in claim 13, wherein a second angle between the first sidewall and the top surface of the substrate, and the second angle is an obtuse angle.

18. The fin field effect transistor (FinFET) device structure as claimed in claim 13, further comprising:
the nitride layer formed on a portion of the second sidewall of the first fin structure, wherein the nitride layer has a top portion and a bottom portion, and a turning point between the top portion and the bottom portion.

19. The fin field effect transistor (FinFET) device structure as claimed in claim 13, wherein the third sidewall intersects the second sidewall at a point, and the point is higher than the top surface of the substrate.

20. The fin field effect transistor (FinFET) device structure as claimed in claim 13, wherein an angle between the third sidewall and the second sidewall is smaller than the first angle.

* * * * *